(12) United States Patent
Babcock

(10) Patent No.: US 8,299,578 B1
(45) Date of Patent: Oct. 30, 2012

(54) HIGH VOLTAGE BIPOLAR TRANSISTOR WITH BIAS SHIELD

(75) Inventor: Jeffrey Babcock, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 555 days.

(21) Appl. No.: 12/590,691

(22) Filed: Nov. 12, 2009

(51) Int. Cl.
*H01L 29/66* (2006.01)

(52) U.S. Cl. ........................................ 257/577; 257/487

(58) Field of Classification Search .................. 257/577, 257/593, 659, 487
See application file for complete search history.

(56) References Cited

U.S. PATENT DOCUMENTS

2003/0113980 A1* 6/2003 Babcock ........................ 438/424

* cited by examiner

*Primary Examiner* — Mark Prenty
(74) *Attorney, Agent, or Firm* — Eugene C. Conser; Wade J. Brady, III; Frederick J. Telecky, Jr.

(57) ABSTRACT

In a SOI process, a high voltage BJT structure with $BV_{CEO}$ versus $F_T$ control is provided by including a bias shield over the laterally extending collector region and controlling the bias of the shield.

9 Claims, 9 Drawing Sheets

HIGH VOLTAGE BIPOLAR TRANSISTOR WITH BIAS SHIELD

FIELD OF THE INVENTION

The present invention relates to bipolar transistors. In particular it deals with vertical bipolar power transistors.

BACKGROUND OF THE INVENTION

In bipolar power transistors a trade-off exists between the collector-emitter breakdown voltage $BV_{CEO}$ and the cut-off frequency $F_T$.

FIG. 1 shows a prior art vertical npn power transistor. The particular BJT shown is a symmetric structure with base contacts 100 to base 102. The base 102 is formed below and extends to either side of a polysilicon emitter 104 with its emitter contact 106. An emitter-base spacer 108 is shown on either side of the emitter poly 104. Symmetrically positioned collector contacts 110, contact an n-buried layer (NBL) regions 112 through sinkers 114 to connect to an n-epitaxial region that defines an n-type collector 118. This symmetric structure with NBL pull-back thus defines a collector-base-emitter-base-collector (CBEBC) layout. It will be appreciated that the emitter-base-collector define a vertical npn structure with a lateral collector link-up (in this case, the emitter poly is n-doped and the base is p-doped). The BJT is formed as part of a Silicon over Isolator (SOI) structure as depicted by the SOI layer 120. By using a SOI structure and defining a symmetric collector arrangement, the BJT is less sensitive to defects in the NBL and is suitable for high voltage applications. It relies on standard BiCMOS process flows and can easily be integrated for high voltage options with the addition of SOI (or by using a deeper well to provide isolation in bulk silicon) and only a minor modification of the intrinsic collector region to support the vertical/lateral breakdown voltages of the desired device). However a disadvantage of the prior art structure of FIG. 1 is that it places the collector contacts far from the emitter region in the case of a laterally contacted collector, while in the case of purely vertical device in order to get higher voltages you need a much thicker epitaxial region or in the case of multiple breakdown devices you need multiple implant regions that may not be compatible with a given buried layer, thereby providing for a long transit time distance for carriers and high base-collector capacitance $C_{BC}$ which slows switching resulting in reduced cut-off frequency $F_T$. The present application seeks to address some of the problems associated with the prior art devices by providing a vertical power BJT with control over the $BV_{CEO}/F_T$ characteristics, by using a bias shield.

SUMMARY OF THE INVENTION

According to the invention there is provided a lateral BJT with $BV_{CEO}$ versus $F_T$ control, comprising an emitter with emitter contact, a base formed underneath the emitter with at least one base contact, at least one collector arranged underneath the base with at least one collector contact positioned laterally with respect to the emitter and the base, and at least one gate (also referred to herein as a bias shield) each gate being positioned between one of the at least one base contact and one of the collector contacts, extending laterally between the base and said collector contact, each gate having a gate contact that is isolated from contacts to the emitter, base, and collector. The gate or bias shield is used to provide a bias field to dynamically control the collector-base breakdown properties while improving shielding between the base and collector contacts to reduce base-collector capacitance (Cbc). For purposes of this invention the phrase extending "between the base and the collector" is to be understood as extending part of the distance between the base and the collector without touching either the base or the collector.

The gate may be isolated from underlying semiconductor material by a shallow trench isolation region. The collector may include a sub-collector region, wherein the sub-collector region may include a laterally extending buried layer connected to a sinker. The base may be configured to have a lateral extension that extends partially over the gate and is isolated from the gate by an oxide layer and provides a site for a base contact. Instead, the base may have a lateral connection. The collector may be a symmetrical structure arranged on both a first and a second side of the emitter and base. In such an embodiment the at least one gate is typically defined by a first gate with gate contact formed on the first side of the base and extending laterally between the base and the collector on the first side, and a second gate with gate contact formed on the second side of the base and extending laterally between the base and the collector on the second side. The BJT may be implemented in a Silicon-on-Insulator (SOI) process and include an oxide layer.

Further, according to the invention, there is provided a method of controlling the $BV_{CEO}$ versus $F_T$ characteristics of a BJT that includes an, a base formed underneath the emitter, and at least one laterally arranged collector, comprising providing at least one shield that has a shield contact and is isolated from underlying semiconductor material and is positioned to extend between the gate and one of the collectors, and applying a bias voltage to at least one of the shields. The $F_T$ may be increased by biasing said shield so as to form an accumulation region beneath the shield. The $BV_{CEO}$ may be increased by biasing the shield so as to form a depletion region beneath the shield. The BJT may be an npn device and the shield may be biased positively to create the accumulation region or it may be biased negatively to create the depletion region.

Still further, according to the invention, there is provided a method of controlling the $BV_{CEO}$ versus $F_T$ characteristics of a BJT with at least one laterally extending collector, comprising controlling the current path parameters between the BJT's emitter and at least one of its collectors by creating an accumulation or depletion region in the current path. The accumulation or depletion region may be created by applying a bias voltage to a bias shield extending laterally between the base and said at least one collector. The bias shield may include a polysilicon gate formed on an isolation layer or any type of bias shield material such as a metal, aluminum, copper, W, etc that acts like a field plate. The $F_T$ may be increased by biasing the shield so as to form an accumulation region beneath the shield. Instead, the $BV_{CEO}$ may be increased by biasing the shield so as to form a depletion region beneath the shield. The material of the bias shields may be chosen to have a certain work function to define an inherent bias on the bias shield even without application of external voltage to the bias shield.

DETAILED DESCRIPTION OF THE INVENTION

Figure 1:
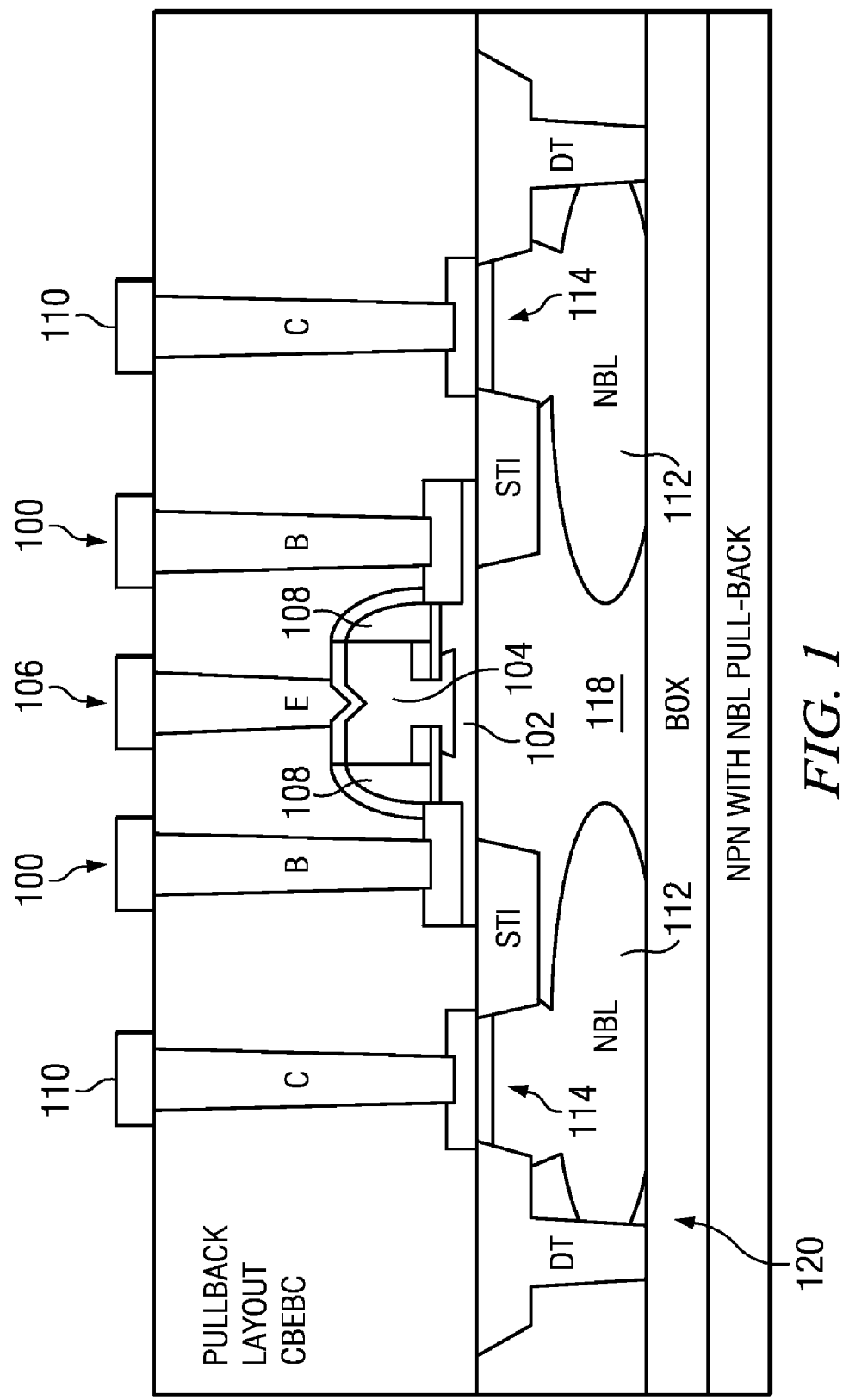
FIG. 1 is a sectional view through a prior art NPN power transistor with CBEBC layout and NBL pull-back.

In the prior art structure of FIG. 1, a high-voltage vertical BJT is built on SOI. To gain higher voltage operation the n-buried layer is pulled back from the active base-emitter region, the doping in this "intrinsic collector region is adjusted to set the desired breakdown voltage characteristics for higher voltage operation using the vertical and lateral regions to deplete when base-collector voltages are applied. The problem however with this prior art approach is that it provides a fixed collector to emitter breakdown voltage (BVCE0) and corresponding cut-off frequency and maximum frequency (FT, Fmax).

Figure 2:
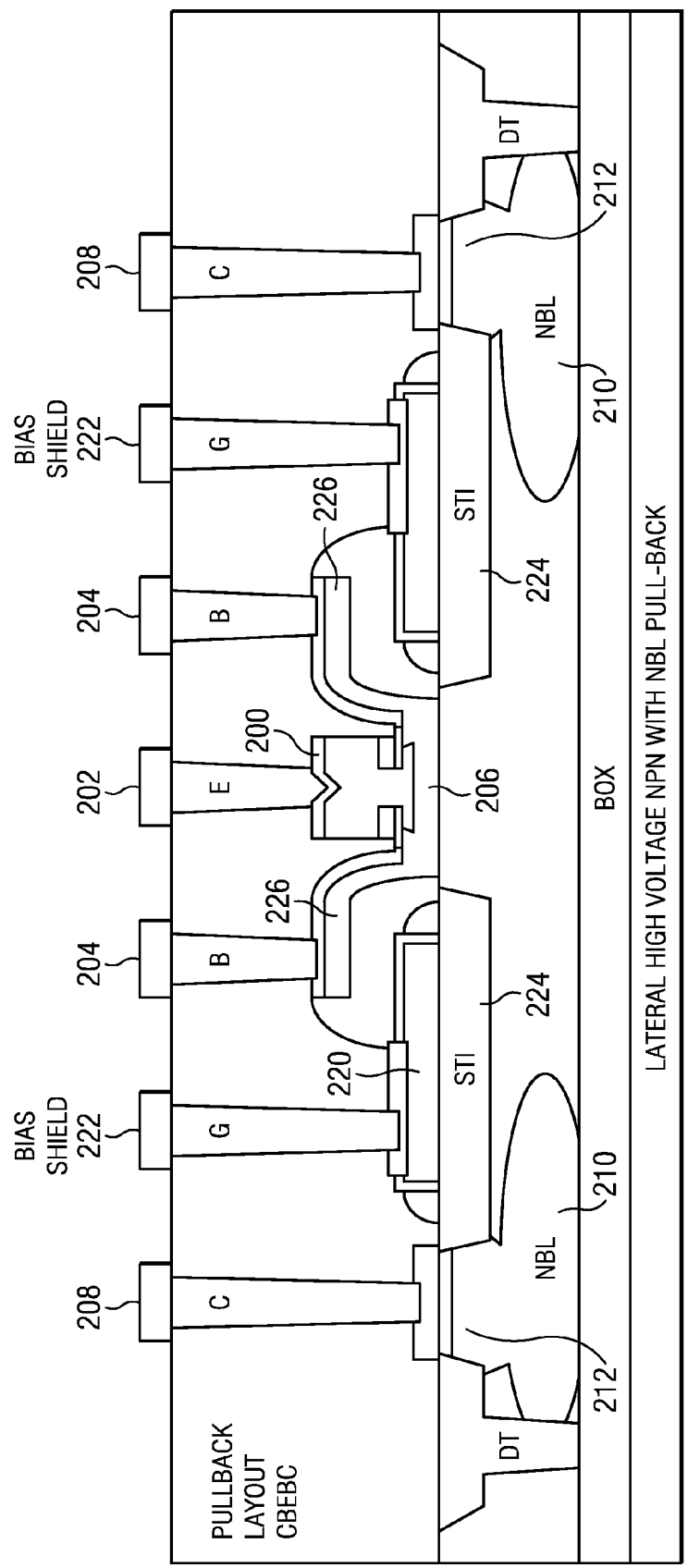
FIG. 2 shows a cross section through one embodiment of a vertical NPN with NBL pull-back in accordance with the invention.

The structure of the embodiment of the invention shown in FIG. 2 is similar to FIG. 1 but adds the bias shield or gate structure between the vertical/lateral collector linkup region allowing application of a bias voltage-resulting in a electrical field that modifies the collector doping concentration in the intrinsic collector regions influenced by the electric field plate (or shield), this allows one to achieve dynamic control of the BVCEO with a separate field plate and optimize electrically the BVCEO versus FT/Fmax trade off. In particular, the embodiment of FIG. 2 shows a vertical BJT having a polysilicon emitter 200 with emitter contact 202, base contacts 204 connecting to a polysilicon base 206 and laterally arranged symmetrical collector contacts 208 connecting to symmetrical NBL regions 210 through sinkers 212. Although the NBL in FIG. 2 is shown symmetrically as a CBEBC contacted bipolar structure, it could be contacted as a CBE contacted bipolar configuration. In such an embodiment an asymmetrical pulled back high voltage transistor is created with one collector contact and bias shield on the base-collector side of the structure. Such an asymmetrical structure has the benefit of minimizing space in IC design. It will be appreciated that the non-symmetrical collector arrangement benefits would be at the expense of a higher resistance. In the above embodiment an npn transistor was discussed, however, the invention applies also to pnp configuration transistors, the bias of the bias shield simply being reversed, as is discussed in greater detail below.

In another embodiment instead of biasing the bias shields externally or in addition to an external bias, the material of the bias shields can be chosen to have a certain work function i.e., an inherent bias that is a function of the Fermi level of the bandgap of the material. This can provide an inherent bias on the bias shield even without application of external voltage to the bias shield.

In addition, the present invention provides for bias shields 220 formed over the laterally extending collector link-up and contacted through contacts 222.

As shown in FIG. 2, the shields 220 are isolated from the underlying silicon by shallow trench isolation (STI) regions 224. As will become clearer from the discussion below, the shields help control the collector-base capacitance $C_{BC}$, in a manner similar to a radio frequency lateral double-diffused MOSFET (RF LDMOS) (the lateral version of the power MOSFET (DMOS), which includes a gate separated by an oxide layer from a p-well and creates an inversion channel at its silicon-oxide interface between oxide layer and p-well by providing a positive gate potential.)

In the above embodiment, the base 206 is configured to have two laterally extending base regions 226 that extend partially over the gate polysilicon layer of the bias shield, thereby allowing a long bias shield to be implemented without physically spacing the collector contacts too far from the base.

Figure 5:
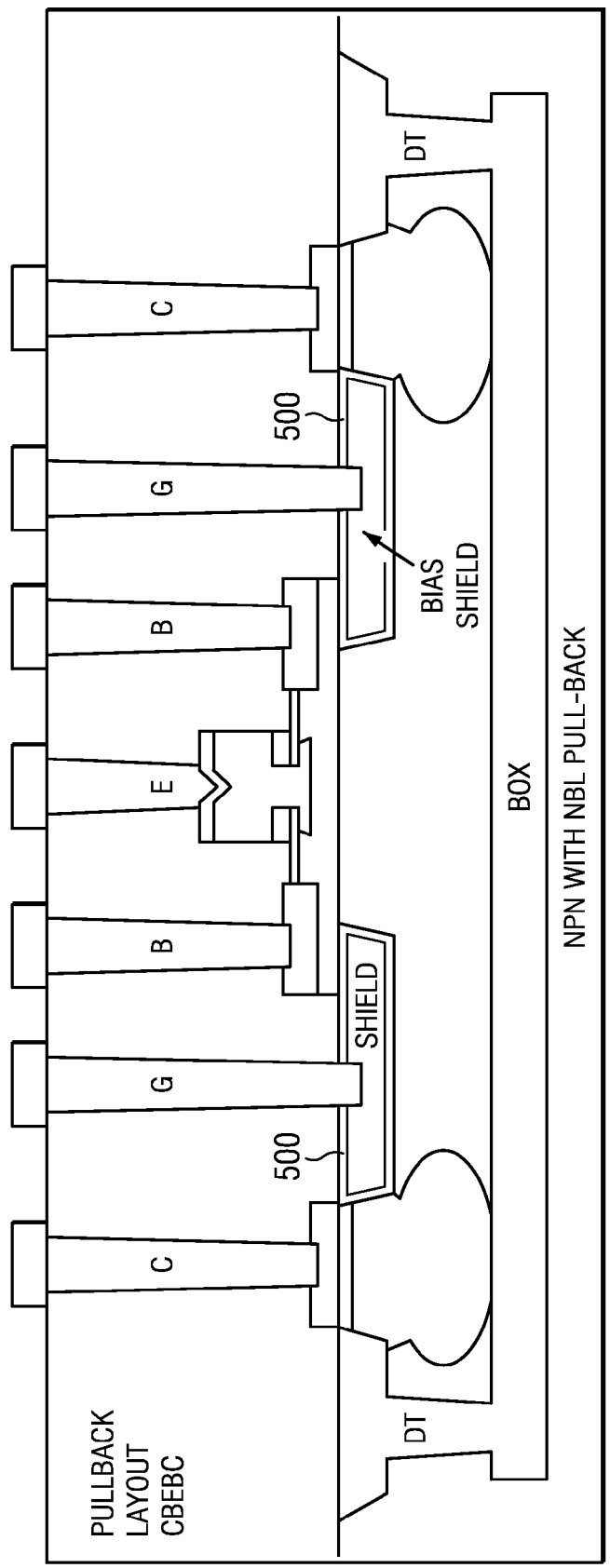
FIG. 5 shows a cross section through yet another embodiment of the invention.

In another embodiment, as shown in FIG. 5, the bias shields are created by forming shallow trenches 500, lining these with an oxide layer and filling with a conductive material such as doped silicon or metal to provide bias shields in closer proximity to the collector conducting region.

Figure 6:
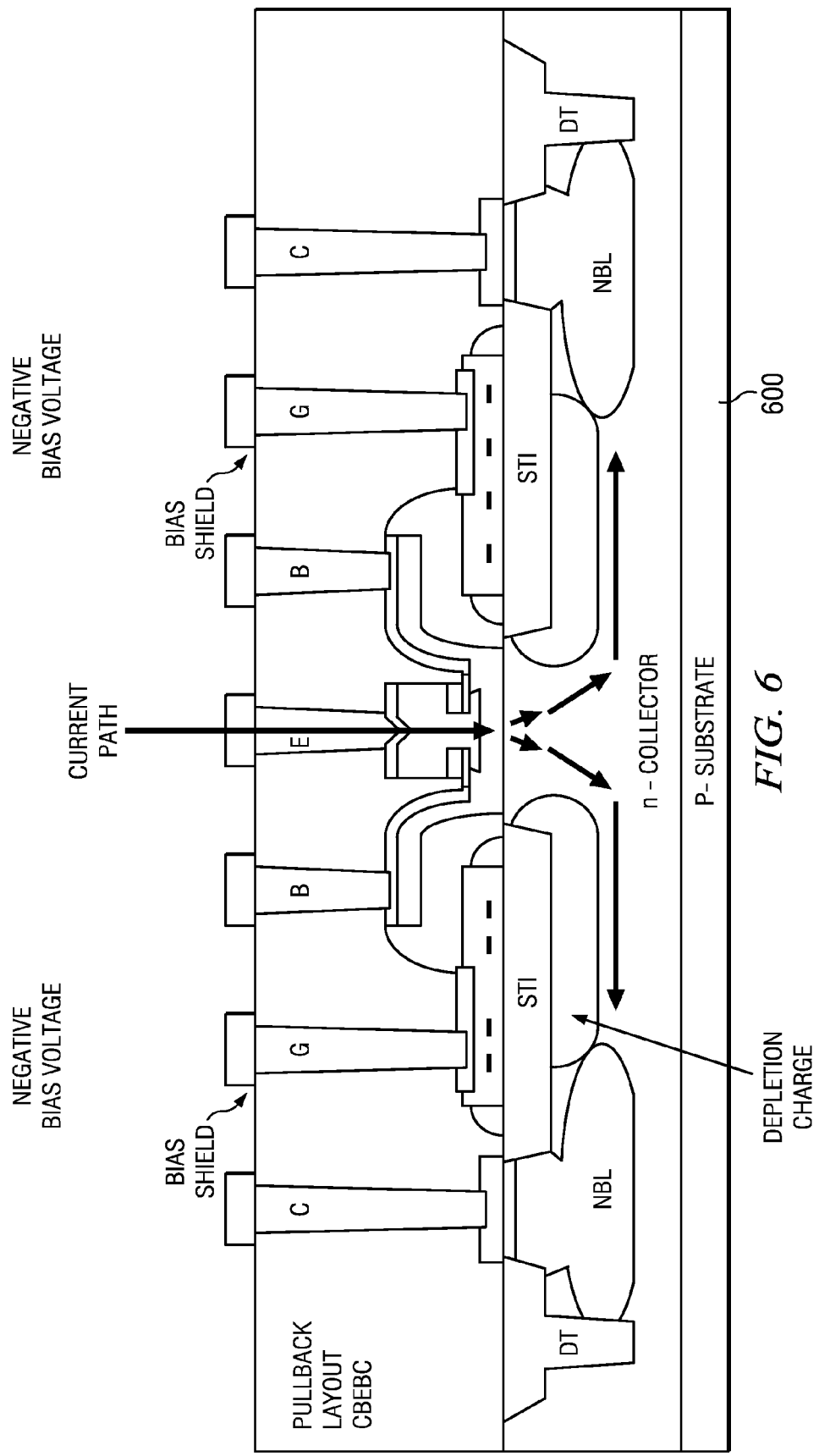
FIG. 6 shows a cross section through yet another embodiment of the invention.

Yet another embodiment is shown in FIG. 6, in which, instead of making use of a SOI process with an isolating trench as in the FIG. 2 embodiment a standard BiCMOS process is adopted, the isolation in this case being provided by the bulk silicon of the p-substrate 600.

Figure 3:
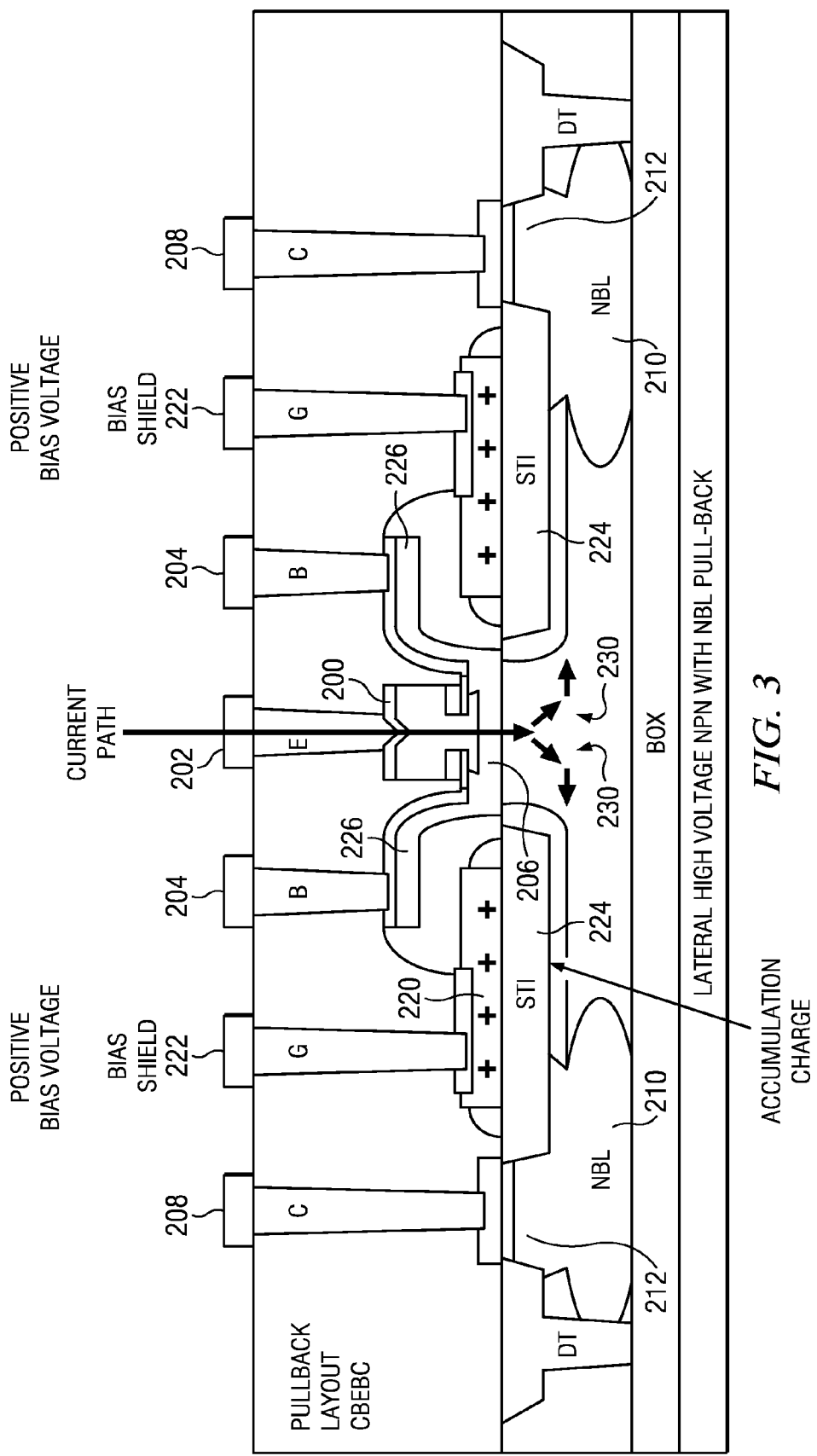
FIGS. 3-4 show a cross section through the transistor of FIG. 2 under different shield bias conditions.
Figure 4:
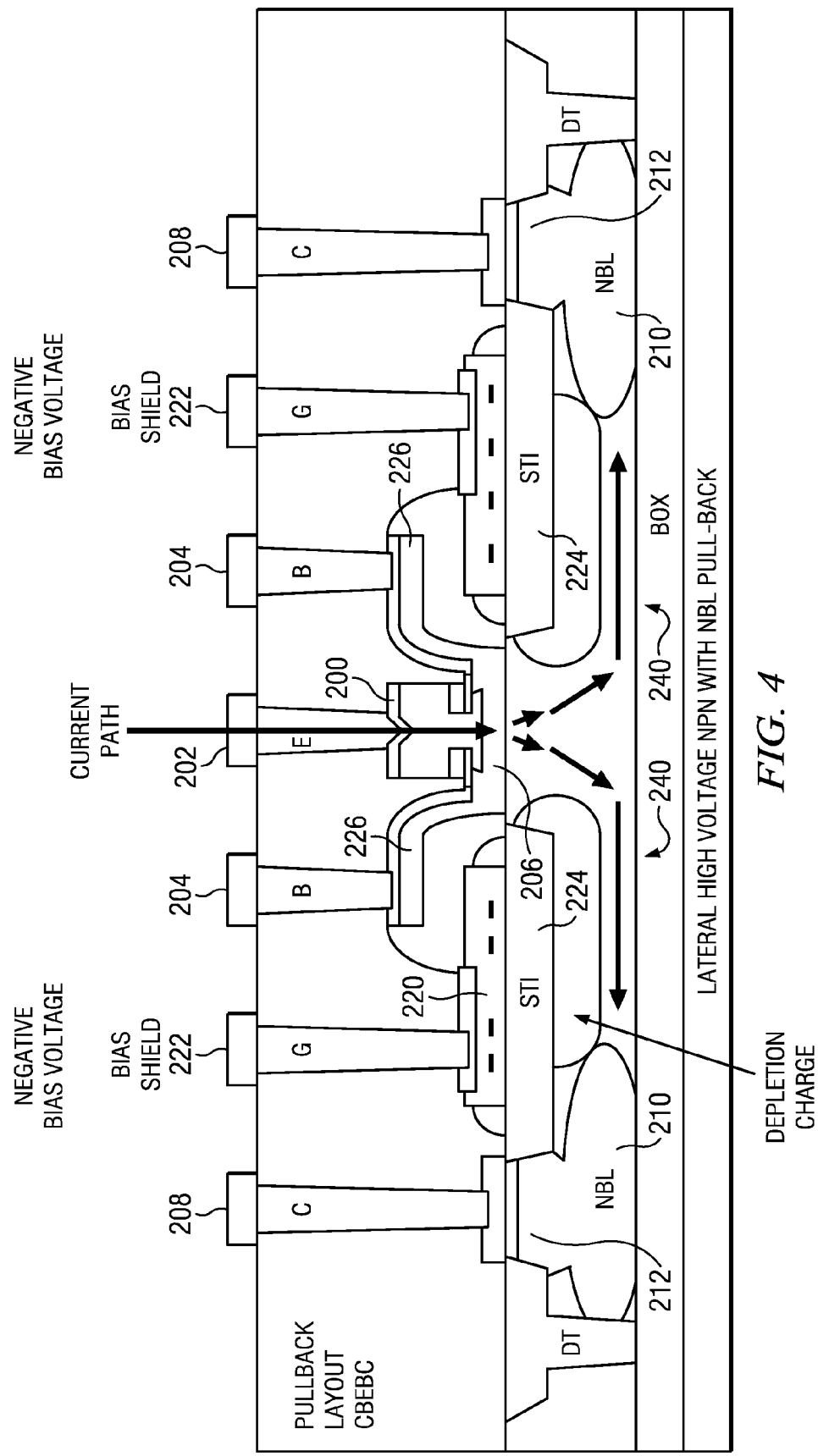

The functioning of the BJT of FIG. 2 can best be understood with respect to FIGS. 3 and 4. In FIG. 3, a positive gate bias is applied to the bias shield 220. This causes an accumulation layer to form at the interface of the STI 224 and the underlying silicon due to the positive charge on the bias shield 220. The accumulation layer effectively reduces the transit time distance for carriers traveling between the base 206 and the collector region, as is depicted by the arrows 230. The shield also helps to reduce the collector-base capacitance $C_{BC}$ by providing a shield between the base 206 and the laterally extending collector link-up region as defined by the sinker, the lateral out diffusion of the NBL and the dynamic link region (accumulation layer) under the gate as determined by the bias on the gate. This reduces the Miller effect (i.e. reduces the increased feedback capacitance between collector and base) which improves frequency response.). As a result of the reduced capacitance and the reduced transit time distance, $F_T$ is increased, allowing for faster switching.

In contrast, as shown in FIG. 4, by applying a negative bias to the shield 220, a depletion layer is formed beneath the bias shield 220 between the STI 224 and the underlying silicon. The resultant negative charge on the bias shield 220 pushes the charge path down, resulting in an increased transit time distance for carriers traveling between the base and the collector region as depicted by the arrows 240. While this increases the collector resistance and decreases $F_T$ it has the benefit of changing the field curvature, thereby providing a higher $BV_{CEO}$. The thin film SOI allows the collector region to be fully depleted, thereby providing a wide range of effects from a highly charged accumulation layer under positive shield bias (with the resultant high $F_T$) to a fully depleted collector region under negative shield bias (with the increased $BV_{CEO}$). Thus the invention is ideally suited to analog applications that desire a dynamically adjustable HV bipolar transistor with $BV_{CEO}$ versus $F_T$ control.

While the above embodiment deals with an npn device, the present invention applies also to pnp devices. It will be appreciated that in a pnp device the bias will be opposite to that discussed above for the npn.

In yet another embodiment, a silicon-over-isolator (SOI) configuration is used and gate bias is provided by making use of a back-end contact.

Figure 7:
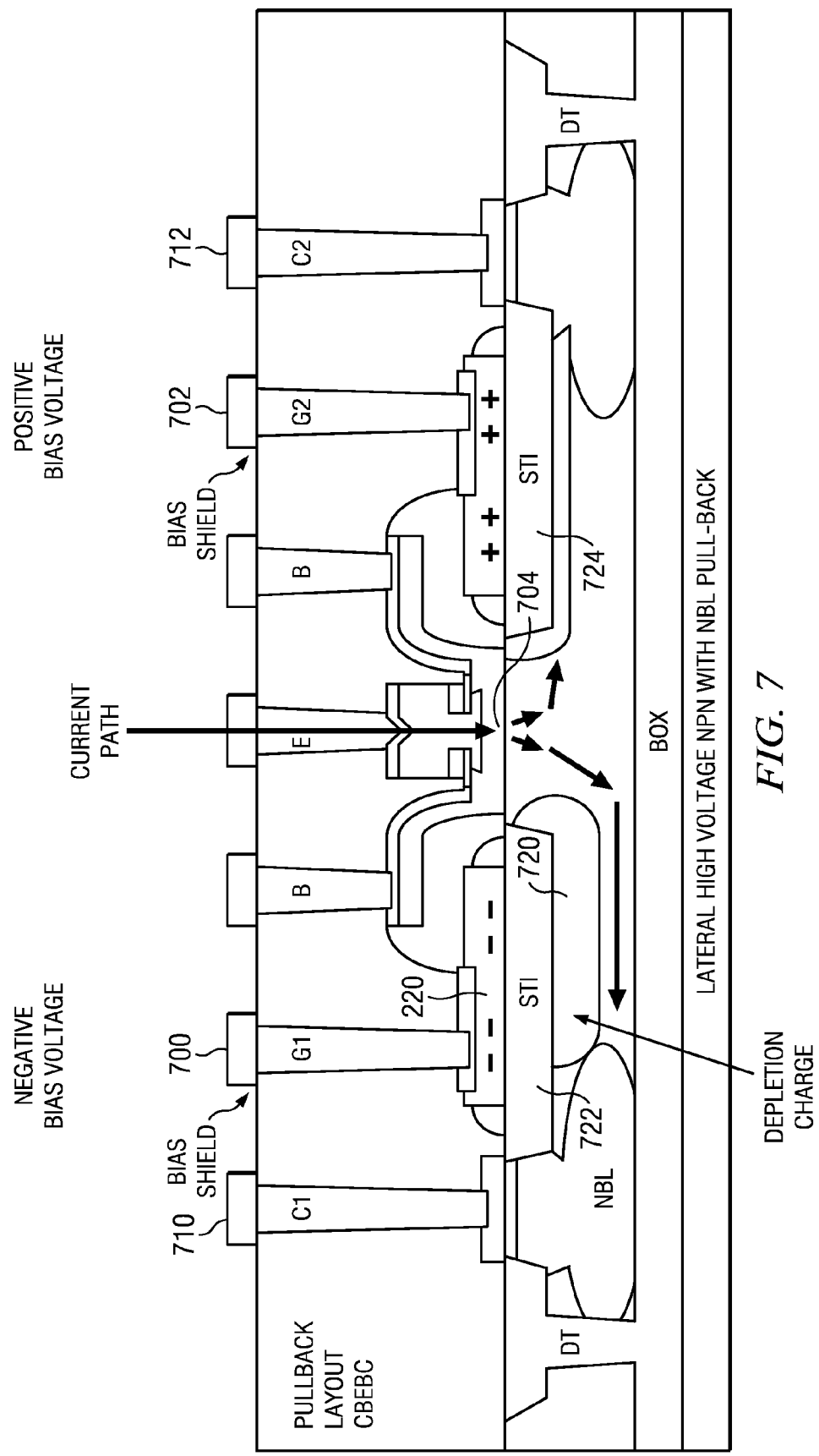
FIG. 7 shows a cross section through an embodiment of a vertical NPN with NBL pull-back in accordance with the invention with different shield bias.
Figure 8:
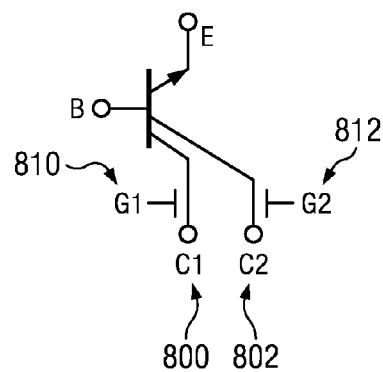
FIG. 8 shows a schematic circuit diagram of the device of FIG. 7.

In yet another embodiment two collector regions are provided but the bias shields are asymmetrically implemented. This can be done by asymmetric placement of the bias shield in two collector regions, or the asymmetric biasing of two bias shields in two collector regions as shown in FIG. 7, assuming designers want to create a BJT with multiple collector feeds. In the embodiment of FIG. 7, bias shields 700, 702 are symmetrically placed between base 704 and collector contacts 710, 712, however the gate or bias shield 700 is biased to create a depletion region 720 under the shallow trench isolation region 722, while the gate or bias shield 702 is positively biased to create an accumulation region under the shallow trench isolation region 724. The device is shown in schematic form in FIG. 8, with its two collectors (C 1, C2) 800. 802.

Even though the voltage to the two collectors VC1, VC2 is kept the same to prevent leakage, current low to the nodes C1, C2 can be changed by changing the collector resistance (which can also be thought of as changing the current path length) by changing the bias on the bias shields or gates (G1, G2) 810, 812.

Figure 9:
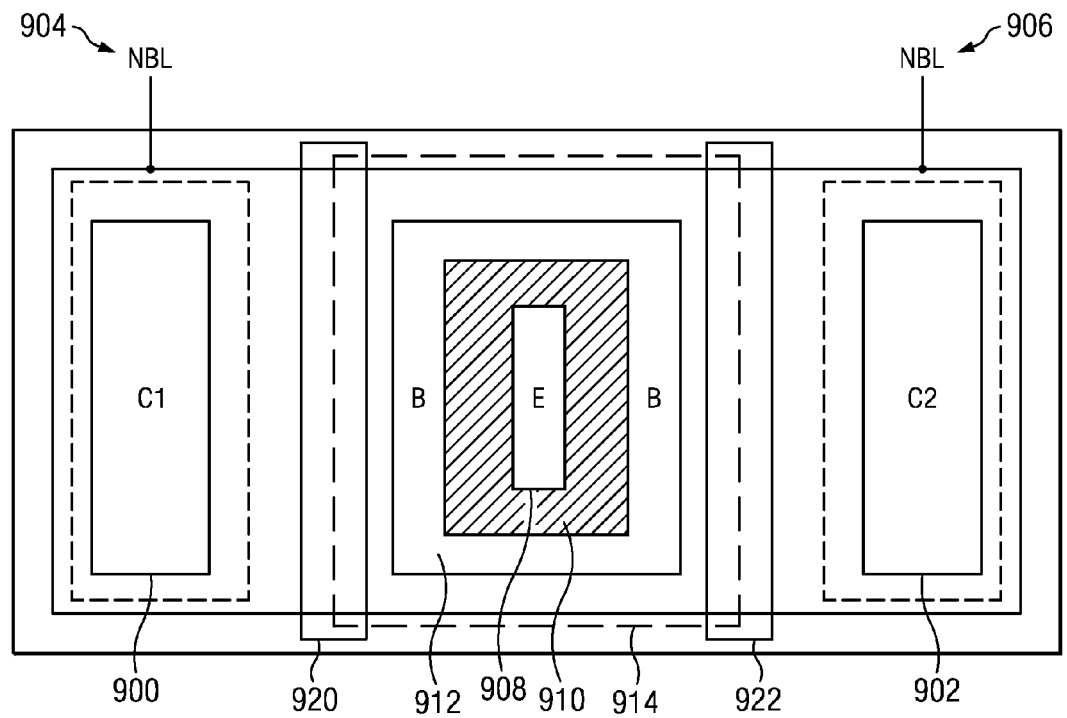
FIG. 9 shows a plan view of one embodiment of a vertical NPN in accordance with the invention.

FIG. 9 shows an embodiment of the invention in plan view, showing the collector contracts 900, 902 contacting the n-buried layers 904, 906. An emitter contact 908 contacts an emitter polysilicon region 910, and a base contact 912 contacts base region 914. Two gates 920, 922 are provided that can either be biased to the same voltage or to different voltages as discussed above.

Figure 10:
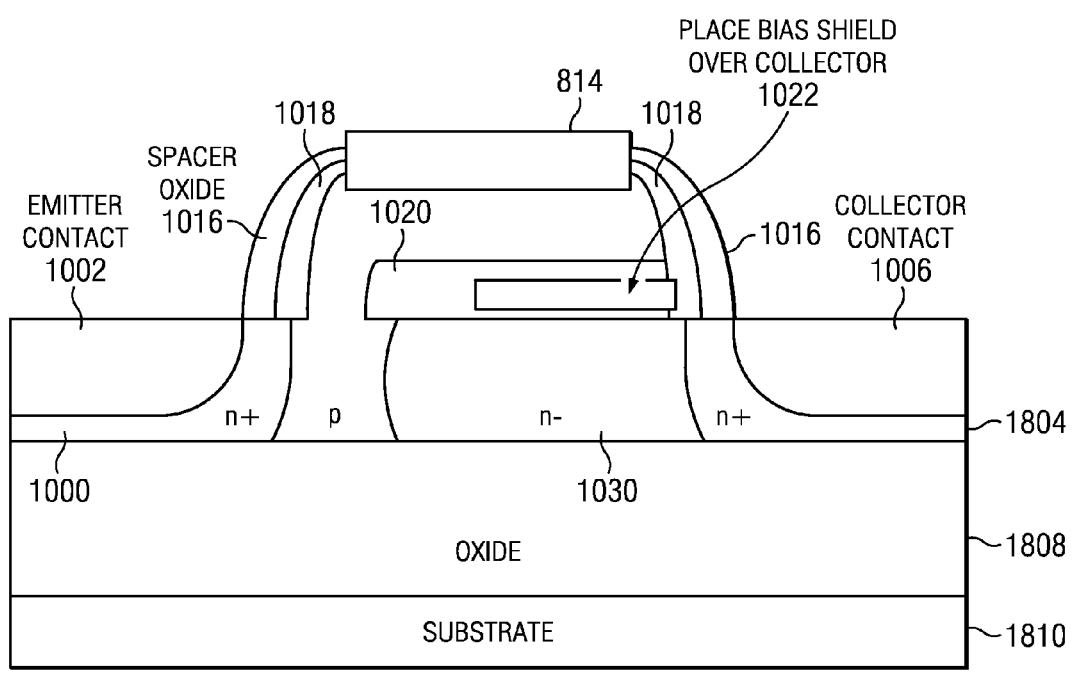
FIG. 10 shows a cross section through one embodiment of an NPN device implemented using thin film technology.

It is therefore within the scope of this disclosure to support different implementations of the invention and to allow different dynamic body bias to the collector feeds. Yet another embodiment of the invention is shown in cross section in FIG. 10, in which thin film technology is used to create a Thin-film-silicon-on-insulator (TFSOI). An n+ emitter 1000 with emitter contact 1002, and an n+ collector with collector 1004 contact 1006 are formed on a buried oxide layer 1008, which is formed on a substrate 1010. A p-type polysilicon gate 1012 is formed between the collector and emitter to define a lateral npn structure. The gate poly 1012 extends downward to the buried oxide 1008. The gate 1012 has oxide spacers 1016 and nitride layers 1018 on either side of it and includes a silicided contact 1014. A portion 1020 of the nitride layer extends on top of a lightly doped n-collector region 1030, and in this embodiment also provides the site for a bias shield 1022 formed over the collector region 1030.

It will therefore be appreciated that the invention can be implemented in different ways while retaining the flexibility of being able to control the $BV_{CEO}$ versus $F_T$ characteristics of a BJT.

What is claimed is:

1. A lateral BJT with BV CEO versus Fr control, comprising
   an emitter with emitter contact,
   a base formed underneath the emitter and having at least one base contact,
   at least one collector extending underneath the base, each collector having
   at least one collector contact positioned laterally with respect to the emitter and the base, and
   at least one bias shield, each bias shield being positioned between one of the at least one base contact and one of the collector contacts, and extending laterally between the base and said collector contact, each bias shield having a bias shield contact that is isolated from contacts to the emitter, base, and any collectors.

2. A BJT of claim 1, wherein the bias shield is isolated from underlying semiconductor material by a shallow trench isolation region.

3. A BJT of claim 2, wherein the collector includes a sub-collector region.

4. A BJT of claim 3, wherein the sub-collector region includes a laterally extending buried layer connected to a sinker.

5. A BJT of claim 4, wherein the base is configured to have a lateral extension that extends partially over the bias shield and is isolated from the bias shield by an oxide layer and provides a site for a base contact.

6. A BJT of claim 2, wherein the collectors form a symmetrical structure by being arranged on both a first and a second side of the emitter and base.

7. A BJT of claim 1, wherein the at least one bias shield is defined by a first bias shield with bias shield contact formed on the first side of the base and extending laterally between the base and a first collector on the first side, and a second bias shield with bias shield contact formed on the second side of the base and extending laterally between the base and a second collector on the second side.

8. A BJT of claim 1, wherein the at least one bias shield is defined by a first set of bias shields each with a bias shield contact formed on the first side of the base and extending laterally between the base and a corresponding first set of collectors on the first side, and a second set of bias shields with each with a bias shield contact formed on the second side of the base and extending laterally between the base and a corresponding second set of collectors on the second side.

9. A BJT of claim 4, further comprising an oxide layer of a SOI configuration.

* * * * *